US012728624B2

(12) United States Patent
Mizutani et al.

(10) Patent No.: US 12,728,624 B2
(45) **Date of Patent: *Sep. 8, 2026**

(54) METHOD OF PRODUCING FERRITIC STAINLESS STEEL SHEET

(71) Applicant: JFE STEEL CORPORATION, Tokyo (JP)

(72) Inventors: Akito Mizutani, Tokyo (JP); Mitsuyuki Fujisawa, Tokyo (JP)

(73) Assignee: JFE STEEL CORPORATION, Tokyo (JP)

( * ) Notice: Subject to any disclaimer, the term of this patent is extended or adjusted under 35 U.S.C. 154(b) by 506 days.

This patent is subject to a terminal disclaimer.

(21) Appl. No.: 18/313,370

(22) Filed: May 8, 2023

(65) Prior Publication Data

US 2023/0271405 A1 Aug. 31, 2023

Related U.S. Application Data

(62) Division of application No. 17/310,471, filed as application No. PCT/JP2020/000292 on Jan. 8, 2020, now abandoned.

(30) Foreign Application Priority Data

Feb. 19, 2019 (JP) ................................ 2019-027219

(51) Int. Cl.
*C21D 6/00* (2006.01)
*B32B 15/01* (2006.01)
(Continued)

(52) U.S. Cl.
CPC ............ *B32B 15/012* (2013.01); *C21D 6/004* (2013.01); *C21D 6/005* (2013.01); *C21D 6/008* (2013.01);
(Continued)

(58) Field of Classification Search
None
See application file for complete search history.

(56) References Cited

U.S. PATENT DOCUMENTS 6,296,953 B1 10/2001 Linden et al.
6,905,651 B2 6/2005 Johansson et al.
(Continued)

FOREIGN PATENT DOCUMENTS

CN 1918314 A 2/2007
CN 102822369 A 12/2012
(Continued)

OTHER PUBLICATIONS

Machine translation of JP2013-079428A. (Year: 2013).*
(Continued)

*Primary Examiner* — Xiaowei Su
(74) *Attorney, Agent, or Firm* — KENJA IP LAW PC

(57) ABSTRACT

A method of producing a ferritic stainless steel sheet comprises subjecting an Al vapor deposited layer-equipped stainless steel sheet to a heat treatment at 600° C. to 1300° C. for 1 minute or more. The Al vapor deposited layer-equipped stainless steel sheet comprises a ferritic stainless steel and an Al vapor deposited layer thereon. The ferritic stainless steel sheet has a thickness of 100 μm or less and a chemical composition containing, in mass %, C: ≤0.030%, Si: ≤1.0%, Mn: ≤1.0%, P: ≤0.040%, S: ≤0.010%, Cr: 11.0-30.0%, Al: 4.0-6.5%, Ni: 0.05-0.50%, Mo: 0.01-6.0%, N: ≤0.020% s, and Zr: 0.01-0.20% and/or Hf: 0.01-0.20%, with a balance consisting of Fe and inevitable impurities. A thickness of the Al vapor deposited layer per one side is 0.5-10.0 μm.

4 Claims, 1 Drawing Sheet

(51) Int. Cl.

| | |
|---|---|
| ***C21D 9/46*** | (2006.01) |
| ***C22C 38/00*** | (2006.01) |
| ***C22C 38/02*** | (2006.01) |
| ***C22C 38/04*** | (2006.01) |
| ***C22C 38/06*** | (2006.01) |
| ***C22C 38/42*** | (2006.01) |
| ***C22C 38/44*** | (2006.01) |
| ***C22C 38/46*** | (2006.01) |
| ***C22C 38/48*** | (2006.01) |
| ***C22C 38/50*** | (2006.01) |
| ***C22C 38/54*** | (2006.01) |
| ***C23C 14/16*** | (2006.01) |

(52) U.S. Cl.

CPC .............. *C21D 9/46* (2013.01); *C22C 38/001* (2013.01); *C22C 38/002* (2013.01); *C22C 38/005* (2013.01); *C22C 38/02* (2013.01); *C22C 38/04* (2013.01); *C22C 38/06* (2013.01); *C22C 38/42* (2013.01); *C22C 38/44* (2013.01); *C22C 38/46* (2013.01); *C22C 38/48* (2013.01); *C22C 38/50* (2013.01); *C22C 38/54* (2013.01); *C23C 14/16* (2013.01)

(56) References Cited

U.S. PATENT DOCUMENTS

| | | | | |
|---|---|---|---|---|
| 7,601,672 | B2 | 10/2009 | Inaguma et al. | |
| 9,028,625 | B2 | 5/2015 | Inaguma et al. | |
| 9,273,382 | B2 | 3/2016 | Mizutani et al. | |
| 9,624,563 | B2 | 4/2017 | Mizutani et al. | |
| 11,767,573 | B2 * | 9/2023 | Mizutani | C23C 2/12 428/653 |
| 2003/0119667 | A1 | 6/2003 | Johansson et al. | |
| 2008/0210348 | A1 * | 9/2008 | Goransson | C22C 38/26 148/537 |
| 2009/0022636 | A1 | 1/2009 | Inaguma et al. | |
| 2009/0274929 | A1 | 11/2009 | Sakamoto et al. | |
| 2015/0299833 | A1 | 10/2015 | Mizutani et al. | |
| 2017/0029916 | A1 | 2/2017 | Mizutani et al. | |
| 2021/0040590 | A1 | 2/2021 | Abe et al. | |

FOREIGN PATENT DOCUMENTS

| | | | | |
|---|---|---|---|---|
| CN | 103459644 | A | 12/2013 | |
| EP | 0370645 | A1 | 5/1990 | |
| EP | 0688882 | A1 | 12/1995 | |
| EP | 2554700 | A1 | 2/2013 | |
| EP | 2695962 | A1 | 2/2014 | |
| JP | H01159384 | A | 6/1989 | |
| JP | H02133563 | A | 5/1990 | |
| JP | H11350083 | A | 12/1999 | |
| JP | 2002507249 | A | 3/2002 | |
| JP | 2004169110 | A | 6/2004 | |
| JP | 2005298912 | A | 10/2005 | |
| JP | 2006144116 | A | 6/2006 | |
| JP | 2007524001 | A | 8/2007 | |
| JP | 5062985 | B2 * | 10/2012 | B01J 35/57 |
| JP | 2013079428 | A * | 5/2013 | |
| JP | 2015078415 | A | 4/2015 | |
| JP | 2016102231 | A | 6/2016 | |
| KR | 790001062 | B1 | 8/1979 | |

OTHER PUBLICATIONS

Machine translation of JP5062985B2. (Year: 2012).*

Jul. 11, 2023, Office Action issued by the Korean Intellectual Property Office in the corresponding Korean Patent Application No. 10-2021-7024236 with English language concise statement of relevance.

Ishii et al., JPH01159384A machine translation, Jun. 22, 1989, entire translation(Year: 1989).

Jan. 14, 2023, Office Action issued by the Korean Intellectual Property Office in the corresponding Korean Patent Application No. 10-2021-7024236 with English language concise statement of relevance.

Kato et al., JPH11350083A Google Machine Translation printed on Mar. 6, 2023, Dec. 21, 1999, entire translation (Year: 1999).

Mar. 24, 2020, International Search Report issued in the International Patent Application No. PCT/JP2020/000292.

May 5, 2022, Office Action issued by the China National Intellectual Property Administration in the corresponding Chinese Patent Application No. 202080012579.7 with English language search report.

Nov. 7, 2022, the Extended European Search Report issued by the European Patent Office in the corresponding European Patent Application No. 20759064.7.

* cited by examiner

METHOD OF PRODUCING FERRITIC STAINLESS STEEL SHEET

CROSS-REFERENCE TO RELATED APPLICATIONS

The present application is a divisional application of U.S. patent application Ser. No. 17/310,471 filed Aug. 5, 2021, which is a National Stage Application of PCT/JP2020/000292 filed Jan. 8, 2020, which claims priority of Japanese Patent Application No. 2019-027219 filed Feb. 19, 2019. The disclosures of the prior applications are hereby incorporated by reference herein in their entirety.

TECHNICAL FIELD

The present disclosure relates to a ferritic stainless steel sheet that has excellent electrical resistivity and oxidation resistance and, even in the case where its thickness is thin, has little deformation such as warpage or distortion, and an Al vapor deposited layer-equipped stainless steel sheet as a material of the ferritic stainless steel sheet.

BACKGROUND

Resistance heating is a method of heating an object by Joule heat generated when passing a current through a resistance heating element. This method has high efficiency of conversion from electrical energy to thermal energy and can be carried out by a simple control unit. Hence, the method is used in a wide range of fields such as industrial electric heating furnaces and electric heating cookers.

Resistance heating elements used in resistance heating can be divided into metallic heating elements such as Ni—Cr alloys and Fe—Cr alloys and non-metallic heating elements such as SiC. Of these, metallic heating elements have better workability than non-metallic heating elements, and accordingly can be worked into foil materials or wire rods. Thus, metallic heating elements can be used in thin members such as window glasses and floors, and members subjected to bending load such as gloves.

As such metallic heating elements, for example, JIS C 2520 defines three types of Ni—Cr alloys (nickel-chromium wires and rolled wires for electrical heating, type 1 to type 3) and two types of Fe—Cr alloys (iron-chromium wires and rolled wires for electrical heating, type 1 to type 2) as alloy wires for electrical heating and alloy rolled wires for electrical heating. Ni—Cr alloys are Ni-based alloys whose main additive elements are Cr: 15% to 21% and Si: 0.75% to 3% (where "%" used in relation to each element is mass %, the same applying hereafter). Fe—Cr alloys are Fe-based alloys whose main additive elements are Cr: 17% to 26%, Al: 2% to 6%, and Si: 1.5% or less.

Of these, Fe—Cr alloys, in particular stainless steel sheets having high Al content (hereafter also referred to as "Al-containing stainless steel sheets"), have excellent oxidation resistance at high temperature and are less expensive than Ni—Cr alloys. Al-containing stainless steel sheets are therefore widely used as resistance heating elements.

As techniques relating to such Al-containing stainless steel sheets, for example, JP H2-133563 A (PTL 1) discloses "a high Al-containing stainless steel sheet production method comprising overlapping an Al sheet on at least one side of a stainless steel sheet containing C≤0.03%, Cr≤30%, and one or more of Ti, Nb, V, and Mo in an amount of 0.01% to 0.8% so as to achieve a proportion corresponding to the amount of Al to be contained, passing them between rolls to obtain a pressure bonded laminated sheet, and subjecting the obtained pressure bonded laminated sheet to a diffusion treatment at a temperature in a range of 600° C. to 1300° C. under the conditions that the Al layer is alloyed without melting".

JP 2004-169110 A (PTL 2) discloses "a Fe—Cr—Al-based stainless steel sheet containing, in mass %, Cr: 10% or more and 30% or less, Al: more than 6.5% and 15% or less, one or both of Ti: 0.02% or more and 0.1% or less and Nb: 0.02% or more and 0.3% or less, La: 0.01% or more and 0.1% or less, Ce: 0.01% or more and 0.1% or less, and P: 0.01% or more and 0.05% or less".

CITATION LIST

Patent Literature

PTL 1: JP H2-133563 A

PTL 2: JP 2004-169110 A

SUMMARY

Technical Problem

An Al-containing stainless steel sheet has high electrical resistivity by Al. However, Al is an element that decreases the toughness of the steel. A higher Al content increases the possibility of cracking in hot rolling or cold rolling.

It is therefore difficult to produce a stainless steel sheet having an Al content of 6.5% or more by a typical casting and rolling method.

In view of this, with the technique described in PTL 1, a pressure bonded laminated sheet is prepared by overlapping an Al sheet on at least one side of a stainless steel sheet as a base steel sheet, and the pressure bonded laminated sheet is subjected to a predetermined heat treatment (hereafter also referred to as "diffusion heat treatment"). Consequently, Al is diffused into the stainless steel sheet, thus increasing the Al content in the stainless steel sheet as a finished product.

With the technique described in PTL 2, a multilayer sheet is prepared by coating the surface of a stainless steel sheet as a base steel sheet with Al or an Al alloy, and the multilayer sheet is subjected to a predetermined diffusion heat treatment (diffusion annealing). Consequently, Al is diffused into the stainless steel sheet, thus increasing the Al content in the stainless steel sheet as a finished product.

However, the techniques described in PTL 1 and PTL 2 have a problem in that deformation such as warpage or distortion tends to occur in the steel sheet in the diffusion heat treatment. This problem is particularly noticeable in the case where the steel sheet is thin. The steel sheet obtained as a result of the diffusion heat treatment has a large amount of Al dissolved therein, and accordingly has considerably increased strength. If deformation such as warpage or distortion occurs in such a steel sheet in the diffusion heat treatment, it is difficult to adjust the steel sheet to the original shape. In the case of performing the diffusion heat treatment on the pressure bonded laminated sheet or the multilayer sheet after working the sheet into a predetermined part shape, too, the problem that deformation occurs in the diffusion heat treatment and the resultant part is deformed arises.

It could therefore be helpful to provide a ferritic stainless steel sheet that has excellent electrical resistivity and oxidation resistance and, even in the case where its thickness is thin, has little deformation such as warpage or distortion, together with a method of producing the same.

It could also be helpful to provide an Al vapor deposited layer-equipped stainless steel sheet as a material of the ferritic stainless steel sheet.

Solution to Problem

We conducted various studies to solve the problems stated above. First, we repeatedly examined and studied why deformation such as warpage or distortion occurs when performing the diffusion heat treatment on the pressure bonded laminated sheet or the multilayer sheet having the Al sheet or the Al or Al alloy coating layer (hereafter also referred to as "Al layer") on the surface of the base steel sheet (stainless steel sheet).

As a result, we found out that the deformation is caused by the change in density when Al diffuses into the base steel sheet.

In detail, when Al diffuses and dissolves into the stainless steel sheet, the density of the stainless steel sheet decreases, and the volume of the stainless steel sheet tends to increase. In the process of the diffusion heat treatment, the Al content in the surface layer becomes higher than the Al content in the center part in the base steel sheet, and the base steel sheet varies in density in the thickness direction. Moreover, if the Al coating weight on the surface of the base steel sheet is not uniform, the density varies in the in-plane direction of the surface of the base steel sheet. This causes stress in the steel sheet. Since stainless steel sheets and in particular ferritic stainless steel sheets do not have very high strength at high temperature, the steel sheet cannot withstand the stress and undergoes deformation such as warpage or distortion.

Based on these findings, we conducted further studies to suppress deformation such as warpage or distortion in the diffusion heat treatment.

We consequently discovered that it is effective to:

(1) appropriately adjust the chemical composition of a ferritic stainless steel sheet as a base steel sheet, specifically, contain at least one selected from the group consisting of Zr and Hf in an appropriate amount and Mo in an appropriate amount, to enhance the strength of the base steel sheet at high temperature while ensuring the oxidation resistance; and (2) form an Al layer on the surface of the base steel sheet by a vapor deposition method and appropriately control the thickness of the Al layer, to prevent the Al coating weight on the surface of the base steel sheet from being not uniform.

By performing a predetermined diffusion heat treatment on an Al vapor deposited layer-equipped stainless steel sheet satisfying both of the conditions (1) and (2), it is possible to obtain a ferritic stainless steel sheet that has excellent electrical resistivity and oxidation resistance and, even in the case where its thickness is thin, has little deformation such as warpage or distortion.

The present disclosure is based on these discoveries and further studies.

We thus provide:

1. A ferritic stainless steel sheet comprising: a chemical composition containing (consisting of), in mass %, C: 0.030% or less, Si: 1.0% or less, Mn: 1.0% or less, P: 0.040% or less, S: 0.010% or less, Cr: 11.0% to 30.0%, Al: 8.0% to 20.0%, Ni: 0.05% to 0.50%, Mo: 0.01% to 6.0%, N: 0.020% or less, and at least one selected from the group consisting of Zr: 0.01% to 0.20% and Hf: 0.01% to 0.20%, with a balance consisting of Fe and inevitable impurities; and a thickness of 100 μm or less.

2. The ferritic stainless steel sheet according to 1., wherein the chemical composition further contains, in mass %, one or more selected from the group consisting of REM: 0.01% to 0.20%, Cu: 0.01% to 0.10%, Ti: 0.01% to 0.50%, Nb: 0.01% to 0.50%, V: 0.01% to 0.50%, W: 0.01% to 6.0%, B: 0.0001% to 0.0050%, Ca: 0.0002% to 0.0100%, and Mg: 0.0002% to 0.0100%.

3. An Al vapor deposited layer-equipped stainless steel sheet comprising: a base steel sheet; and an Al vapor deposited layer on a surface of the base steel sheet, wherein the base steel sheet is a ferritic stainless steel sheet having a thickness of 100 μm or less and a chemical composition containing, in mass %, C: 0.030% or less, Si: 1.0% or less, Mn: 1.0% or less, P: 0.040% or less, S: 0.010% or less, Cr: 11.0% to 30.0%, Al: 4.0% to 6.5%, Ni: 0.05% to 0.50%, Mo: 0.01% to 6.0%, N: 0.020% or less, and at least one selected from the group consisting of Zr: 0.01% to 0.20% and Hf: 0.01% to 0.20%, with a balance consisting of Fe and inevitable impurities, and a thickness of the Al vapor deposited layer per one side is 0.5 μm to 10.0 μm.

4. The Al vapor deposited layer-equipped stainless steel sheet according to 3., wherein the chemical composition of the base steel sheet further contains, in mass %, one or more selected from the group consisting of REM: 0.01% to 0.20%, Cu: 0.01% to 0.10%, Ti: 0.01% to 0.50%, Nb: 0.01% to 0.50%, V: 0.01% to 0.50%, W: 0.01% to 6.0%, B: 0.0001% to 0.0050%, Ca: 0.0002% to 0.0100%, and Mg: 0.0002% to 0.0100%.

5. A method of producing the ferritic stainless steel sheet according to 1. or 2., the method comprising subjecting the Al vapor deposited layer-equipped stainless steel sheet according to 3. or 4. to a heat treatment of holding in a temperature range of 600° C. to 1300° C. for 1 minute or more.

Advantageous Effect

It is thus possible to obtain a ferritic stainless steel sheet that has excellent electrical resistivity and oxidation resistance and, even in the case where its thickness is thin, has little deformation such as warpage or distortion.

The ferritic stainless steel sheet has excellent oxidation resistance particularly at high temperature, and therefore is suitable for use in a heating element of an exhaust gas heater installed immediately upstream of an exhaust gas purifier in a vehicle and the like, a heating element of an electric heating furnace or an electric heating cooker, a catalyst support, etc.

DETAILED DESCRIPTION

One of the disclosed embodiments will be described below.

Figure 1:
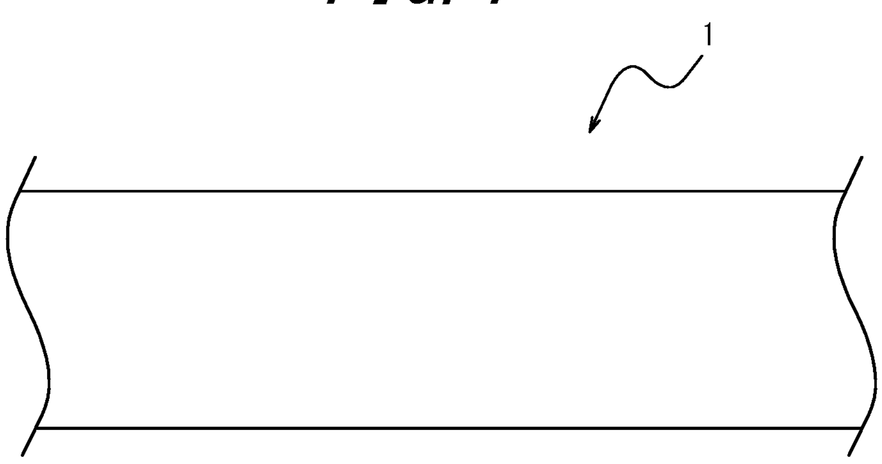
FIG. 1 is a schematic diagram of a ferritic stainless steel sheet according to one of the disclosed embodiments.

First, the chemical composition of a ferritic stainless steel sheet (see FIG. 1, where reference sign 1 is a ferritic stainless steel sheet) according to one of the disclosed embodiments will be described below. While the unit of the content of each element in the chemical composition is "mass %", the content is expressed simply in "%" unless otherwise specified.

C: 0.030% or less

If the C content is more than 0.030%, the toughness of the steel sheet decreases, making it difficult to produce a base steel sheet of an Al vapor deposited layer-equipped stainless steel sheet (hereafter also simply referred to as "base steel sheet") having a thickness of 100 μm or less. The Al vapor deposited layer-equipped stainless steel sheet is a material for producing the ferritic stainless steel sheet according to one of the disclosed embodiments. The C content is therefore 0.030% or less. The C content is preferably 0.020% or less, and more preferably 0.010% or less. No lower limit is placed on the C content, but the C content is preferably 0.001% or more.

Si: 1.0% or less

Si has a function of increasing the electrical resistivity of the ferritic stainless steel sheet. The electrical resistivity improving effect of Si per mass % is approximately equal to that of Al. From the viewpoint of achieving this effect, the Si content is preferably 0.01% or more. The Si content is more preferably 0.10% or more. If the Si content is more than 1.0%, the steel hardens excessively, making it difficult to produce the base steel sheet. The Si content is therefore 1.0% or less. The Si content is preferably 0.50% or less, and more preferably 0.20% or less.

Mn: 1.0% or less

If the Mn content is more than 1.0%, the oxidation resistance of the steel decreases. The Mn content is therefore 1.0% or less. The Mn content is preferably 0.50% or less, and more preferably 0.15% or less. If the Mn content is less than 0.01%, refining is difficult. Accordingly, the Mn content is preferably 0.01% or more.

P: 0.040% or less

If the P content is more than 0.040%, the toughness and ductility of the steel decrease, making the production of the base steel sheet difficult. The P content is therefore 0.040% or less. The P content is preferably 0.030% or less. No lower limit is placed on the P content. However, since excessive dephosphorization leads to increased costs, the P content is preferably 0.005% or more.

S: 0.010% or less

If the S content is more than 0.010%, the hot workability decreases, making the production of the base steel sheet difficult. The S content is therefore 0.010% or less. The S content is preferably 0.004% or less, and more preferably 0.002% or less. No lower limit is placed on the S content. However, since excessive desulfurization leads to increased costs, the S content is preferably 0.0005% or more.

Cr: 11.0% to 30.0%

Cr is an element necessary to ensure the oxidation resistance at high temperature. Cr also has a function of increasing the electrical resistivity, though to a less extent than Al and Si. If the Cr content is less than 11.0%, the oxidation resistance at high temperature cannot be ensured sufficiently. If the Cr content is more than 30.0%, the toughness of the slab or the hot-rolled steel sheet in the production process decreases, making the production of the base steel sheet difficult. The Cr content is therefore 11.0% to 30.0%. The Cr content is preferably 15.0% or more, and more preferably 18.0% or more. The Cr content is preferably 26.0% or less, and more preferably 22.0% or less.

Al: 8.0% to 20.0%

Al has an effect of increasing the electrical resistivity. Al also has an effect of improving the oxidation resistance by forming an oxidation layer mainly composed of $Al_2O_3$ at high temperature when the steel sheet is used as a resistance heating element. To achieve the desired high electrical resistivity, the Al content needs to be 8.0% or more. If the Al content is more than 20.0%, the steel becomes brittle, making it difficult to work the steel sheet into a predetermined part shape. The Al content is therefore 8.0% to 20.0%. The Al content is preferably 9.0% or more. The Al content is preferably 15.0% or less, and more preferably 12.5% or less.

Ni: 0.05% to 0.50%

Ni has an effect of improving the brazing property when producing a resistance heating element. From the viewpoint of achieving this effect, the Ni content is 0.05% or more. Meanwhile, Ni is an element that stabilizes austenite microstructure. Accordingly, if the Ni content is high, particularly if the Ni content is more than 0.50%, austenite microstructure tends to form when the steel sheet is used as a resistance heating element. In detail, during use as a resistance heating element, if oxidation at high temperature progresses and Al in the steel is exhausted, austenite microstructure tends to form. In the case where austenite microstructure forms, the coefficient of thermal (heat) expansion of the part changes, which may result in problems such as a fracture of the part. The Ni content is therefore 0.50% or less. The Ni content is preferably 0.20% or less.

Mo: 0.01% to 6.0%

Mo has an effect of, by increasing the strength at high temperature, suppressing deformation such as warpage or distortion in the base steel sheet in the diffusion heat treatment. Mo also contributes to longer life when the ferritic stainless steel sheet is used as a resistance heating element. These effects are achieved if the Mo content is 0.01% or more. If the Mo content is more than 6.0%, the workability decreases. The Mo content is therefore 0.01% to 6.0%. The Mo content is preferably 0.10% or more, and more preferably 1.00% or more. The Mo content is preferably 4.00% or less, and more preferably 1.50% or less.

N: 0.020% or less

If the N content is more than 0.020%, the toughness decreases, making the production of the base steel sheet difficult. The N content is therefore 0.020% or less. The N content is preferably 0.010% or less. No lower limit is placed on the N content. However, since excessive denitrification leads to increased costs, the N content is preferably 0.001% or more.

At least one selected from the group consisting of Zr: 0.01% to 0.20% and Hf: 0.01% to 0.20%

Zr and Hf improve the adhesion property of $Al_2O_3$ that forms at high temperature when the steel sheet is used as a resistance heating element. In particular, Zr and Hf have an effect of improving the exfoliation resistance of the $Al_2O_3$ layer and thus improving the oxidation resistance in an environment in which oxidation repeatedly occurs. Zr and Hf also have an effect of extending the life when the ferritic stainless steel sheet is used as a resistance heating element, by decreasing the growth rate of $Al_2O_3$. From the viewpoint of achieving these effects, the Zr content and the Hf content are each 0.01% or more. If the Zr content and the Hf content are each more than 0.20%, the element may form an intermetallic compound with Fe or the like and cause a decrease in toughness.

Accordingly, the content of each of Zr and Hf is preferably 0.01% to 0.20%. The content is preferably 0.02% or more. The content is preferably 0.15% or less. The content is more preferably 0.10% or less.

One of Zr and Hf may be contained, or both Zr and Hf may be contained. In the case of containing both Zr and Hf, the total content of Zr and Hf is preferably 0.20% or less. The total content of Zr and Hf is more preferably 0.15% or less.

While the basic components have been described above, the chemical composition may optionally further contain, in addition to the basic components, one or more selected from the group consisting of REM: 0.01% to 0.20%, Cu: 0.01% to 0.10%, Ti: 0.01% to 0.50%, Nb: 0.01% to 0.50%, V: 0.01% to 0.50%, W: 0.01% to 6.0%, B: 0.0001% to 0.0050%, Ca: 0.0002% to 0.0100%, and Mg: 0.0002% to 0.0100%.

REM: 0.01% to 0.20%

REM refers to Sc, Y, and lanthanoid-based elements (elements of atomic numbers 57 to 71 such as La, Ce, Pr, Nd, and Sm). REM has an effect of improving the adhesion property of an $Al_2O_3$ layer that forms at high temperature when the steel sheet is used as a resistance heating element. In particular, REM has an effect of improving the exfoliation resistance of the $Al_2O_3$ layer in an environment in which oxidation repeatedly occurs. This effect is achieved if the REM content (the total content of Sc, Y, and lanthanoid-based elements) is 0.01% or more. If the REM content is more than 0.20%, the hot workability decreases, making the production of the base steel sheet difficult. Accordingly, in the case of containing REM, the REM content is 0.01% to 0.20%. The REM content is more preferably 0.03% or more. The REM content is more preferably 0.10% or less.

As REM, one element from among Sc, Y, and lanthanoid-based elements may be contained, or two or more elements from among Sc, Y, and lanthanoid-based elements may be contained together.

Cu: 0.01% to 0.10%

Cu has an effect of precipitating into the steel and improving the high-temperature strength, and accordingly may be optionally contained in an amount of 0.01% or more. If the Cu content is more than 0.10%, the toughness of the steel decreases. Accordingly, in the case of containing Cu, the Cu content is 0.01% to 0.10%.

Ti: 0.01% to 0.50%

Ti has an effect of combining with C or N in the steel and improving the toughness and an effect of improving the oxidation resistance. Accordingly, Ti may be optionally contained in an amount of 0.01% or more. If the Ti content is more than 0.50%, a large amount of Ti oxide mixes into the $Al_2O_3$ layer which forms at high temperature when the steel sheet is used as a resistance heating element, as a result of which the oxidation resistance at high temperature decreases. Accordingly, in the case of containing Ti, the Ti content is 0.01% to 0.50%. The Ti content is more preferably 0.05 or more. The Ti content is more preferably 0.20% or less.

Nb: 0.01% to 0.50%

Nb has an effect of combining with C or N in the steel and improving the toughness. Accordingly, Nb may be optionally contained in an amount of 0.01% or more. If the Nb content is more than 0.50%, a large amount of Nb oxide mixes into the $Al_2O_3$ layer which forms at high temperature when the steel sheet is used as a resistance heating element, as a result of which the oxidation resistance at high temperature decreases. Accordingly, in the case of containing Nb, the Nb content is 0.01% to 0.50%. The Nb content is more preferably 0.05% or more. The Nb content is more preferably 0.15% or less.

V: 0.01% to 0.50%

V has an effect of combining with C or N in the steel and improving the toughness. Accordingly, V may be optionally contained in an amount of 0.01% or more. If the V content is more than 0.50%, a large amount of V oxide mixes into the $Al_2O_3$ layer which forms at high temperature when the steel sheet is used as a resistance heating element, as a result of which the oxidation resistance at high temperature decreases. Accordingly, in the case of containing V, the V content is 0.01% to 0.50%. The V content is more preferably 0.05% or more. The V content is more preferably 0.10% or less.

W: 0.01% to 6.0%

W has an effect of, by increasing the strength at high temperature, suppressing deformation such as warpage or distortion in the base steel sheet in the diffusion heat treatment. W also contributes to longer life when the ferritic stainless steel sheet is used as a resistance heating element. These effects are achieved if the W content is 0.01% or more. If the W content is more than 6.0%, the workability decreases. Accordingly, in the case of containing W, the W content is 0.01% to 6.0%. The W content is more preferably 0.5% or more. The W content is more preferably 5.0% or less.

In the case of containing both Mo and W, the total content of Mo and W is preferably 6.0% or less, from the viewpoint of preventing a decrease in workability.

B: 0.0001% to 0.0050%

B has an effect of strengthening the grain boundaries of the steel and preventing cracking in hot rolling in the production process of the base steel sheet. This effect is achieved if the B content is 0.0001% or more. If the B content is more than 0.0050%, the oxidation resistance decreases. Accordingly, in the case of containing B, the B content is 0.0001% to 0.0050%. The B content is more preferably 0.0010% or more. The B content is more preferably 0.0040% or less.

Ca: 0.0002% to 0.0100%, Mg: 0.0002% to 0.0100%

An appropriate amount of Ca or Mg has an effect of improving the oxidation resistance by improving the property of adhesion of the $Al_2O_3$ layer, which is formed when the steel sheet is used as a resistance heating element, to the steel and decreasing the growth rate of the $Al_2O_3$ layer. This effect is achieved if the Ca content is 0.0002% or more and if the Mg content is 0.0002% or more. More preferably, the Ca content is 0.0005% or more, and the Mg content is 0.0015% or more. Further preferably, the Ca content is 0.0010% or more. If these elements are contained excessively, the toughness and the oxidation resistance decrease. Accordingly, in the case of containing Ca and Mg, the Ca content and the Mg content are each 0.0100% or less. The Ca content and the Mg content are each more preferably 0.0050% or less.

The components other than those described above are Fe and inevitable impurities.

The thickness of the ferritic stainless steel sheet according to one of the disclosed embodiments is 100 μm or less. In the case of using the ferritic stainless steel sheet in a resistance heating element of, for example, an exhaust gas heater installed immediately upstream of an exhaust gas purifier, the ferritic stainless steel sheet is preferably thin in order to reduce the back pressure and increase the contact area between the resistance heating element and the exhaust gas. In the case of using the ferritic stainless steel sheet in a heating element of, for example, an electrical heating cooker, the heating efficiency increases when the cross-sectional area is reduced and the surface area is increased, i.e. when the ferritic stainless steel sheet is thinner. The thickness is preferably 80 μm or less.

No lower limit is placed on the thickness, but the thickness is preferably 20 μm or more in order to ensure the strength.

Figure 2:
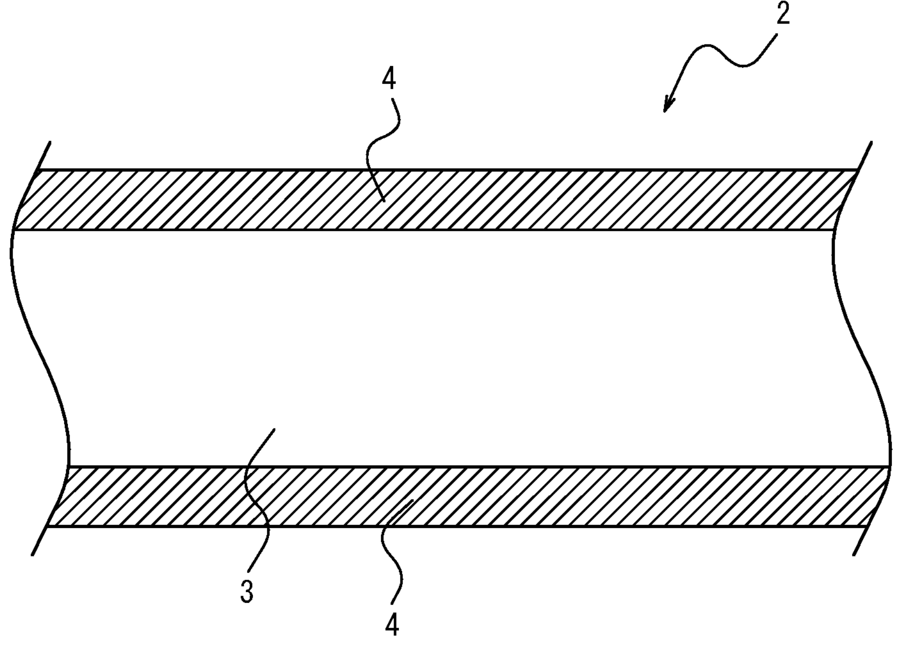
FIG. 2 is a schematic diagram of an Al vapor deposited layer-equipped stainless steel sheet according to one of the disclosed embodiments.

An Al vapor deposited layer-equipped stainless steel sheet (see FIG. 2, where reference sign 2 is an Al vapor deposited layer-equipped stainless steel sheet, 3 is a base steel sheet, and 4 is an Al vapor deposited layer) as a material for producing the foregoing ferritic stainless steel sheet will be described below.

First, the base steel sheet of the Al vapor deposited layer-equipped stainless steel sheet will be described below.

The base steel sheet of the Al vapor deposited layer-equipped stainless steel sheet is a ferritic stainless steel sheet (material ferritic stainless steel sheet) having a thickness of 100 μm or less and a chemical composition containing, in mass %, C: 0.030% or less, Si: 1.0% or less, Mn: 1.0% or less, P: 0.040% or less, S: 0.010% or less, Cr: 11.0% to 30.0%, Al: 4.0% to 6.5%, Ni: 0.05% to 0.50%, Mo: 0.01% to 6.0%, N: 0.020% or less, and at least one selected from the group consisting of Zr: 0.01% to 0.20% and Hf: 0.01% to 0.20%, and optionally containing, in mass %, one or more selected from the group consisting of REM: 0.01% to 0.20%, Cu: 0.01% to 0.10%, Ti: 0.01% to 0.50%, Nb: 0.01% to 0.50%, V: 0.01% to 0.50%, W: 0.01% to 6.0%, B: 0.0001% to 0.0050%, Ca: 0.0002% to 0.0100%, and Mg: 0.0002% to 0.0100%, with the balance consisting of Fe and inevitable impurities.

The chemical composition of the base steel sheet of the Al vapor deposited layer-equipped stainless steel sheet will be described below. While the unit of the content of each element in the chemical composition is "mass %", the content is expressed simply in "%" unless otherwise specified. In the chemical composition of the base steel sheet of the Al vapor deposited layer-equipped stainless steel sheet, the contents of the elements other than Al can be the same as those in the foregoing ferritic stainless steel sheet according to one of the disclosed embodiments, and accordingly their description is omitted.

Al: 4.0% to 6.5%

If the Al content in the base steel sheet is more than 6.5%, the toughness of the steel decreases, making the production of the base steel sheet difficult. If the Al content in the base steel sheet is less than 4.0%, the time required for vapor deposition increases, and the productivity decreases. The Al content in the base steel sheet of the Al vapor deposited layer-equipped stainless steel sheet is therefore 4.0% to 6.5%. The Al content is preferably 5.0% or more. The Al content is preferably 6.0% or less.

The thickness of the base steel sheet of the Al vapor deposited layer-equipped stainless steel sheet is 100 μm or less. The thickness is preferably 80 μm or less. Regarding the lower limit, the thickness is preferably 20 μm or more.

Next, an Al vapor deposited layer formed on the surface of the base steel sheet of the Al vapor deposited layer-equipped stainless steel sheet will be described below.

The Al vapor deposited layer is made of Al and inevitable impurities, and formed on one or both sides of the base steel sheet by a vapor deposition method.

The thickness of the Al vapor deposited layer needs to be 0.5 μm to 10.0 μm per one side.

In detail, if the thickness of the Al vapor deposited layer is less than 0.5 μm per one side, the amount of Al diffused into the base steel sheet is insufficient. Consequently, the desired Al content cannot be obtained in the ferritic stainless steel sheet as a finished product. If the thickness of the Al vapor deposited layer is more than 10.0 μm, the amount of Al diffused into the base steel sheet is excessively large. This may cause the base steel sheet to deform in the diffusion heat treatment. Moreover, the time required for vapor deposition increases, and the productivity decreases.

The thickness of the Al vapor deposited layer is therefore 0.5 μm to 10.0 μm per one side. The thickness is preferably 1.0 μm or more. The thickness is preferably 5.0 μm or less.

The thickness of the Al vapor deposited layer is measured by the following method:

A test piece of 10 mm in width and 15 mm in length is cut from the Al vapor deposited layer-equipped stainless steel sheet. The test piece is buried in resin so as to expose a cross-section in the length direction (rolling direction), and the cross-section is mirror polished. The cross-section is then observed using a scanning electron microscope (SEM) with 5000 magnification, and the thickness of the Al vapor deposited layer (the distance from the interface between the Al vapor deposited layer and the base steel sheet to the surface of the Al vapor deposited layer) per side is measured in five locations at intervals of 1 mm in the length direction (rolling direction) from the longitudinal (rolling direction) center position of the test piece. The average value of these measurement values is taken to be the thickness of the Al vapor deposited layer in the Al vapor deposited layer-equipped stainless steel sheet.

In the Al vapor deposited layer-equipped stainless steel sheet, the Al vapor deposited layer may be provided only on one side of the base steel sheet or provided on both sides of the base steel sheet.

A method of producing the ferritic stainless steel sheet according to one of the disclosed embodiments will be described below.

The ferritic stainless steel sheet according to one of the disclosed embodiments is produced by subjecting the foregoing Al vapor deposited layer-equipped stainless steel sheet to a heat treatment (diffusion heat treatment) of holding in a temperature range of 600° C. to 1300° C. for 1 minute or more, to diffuse Al contained in the Al vapor deposited layer into the base steel sheet of the Al vapor deposited layer-equipped stainless steel sheet and increase the Al content in the base steel sheet to 8.0% or more.

From the viewpoint of homogenizing Al diffused, it is preferable to hold the Al vapor deposited layer-equipped stainless steel sheet in a temperature range of 900° C. to 1200° C. for 10 minutes or more. No upper limit is placed on the holding time, but the holding time is preferably 120 minutes or less from the viewpoint of productivity and the like.

The atmosphere in the heat treatment may be air, but it is preferable to perform the heat treatment in a vacuum of $1\times10^{-1}$ Pa or less, or a non-oxidizing atmosphere such as an inert atmosphere of Ar or the like, a $N_2$ atmosphere, or a mixed atmosphere of $H_2$ and $N_2$, in order to reduce the consumption of Al by oxidation.

The heat treatment may be performed before working the steel sheet into the finished part, or after working the steel sheet into a predetermined shape such as a resistance heating element.

For example, in the case where a high-temperature brazing treatment is performed in the production process of the member such as a resistance heating element or the use temperature of the member exceeds 900° C., such heating may be substituted for the heat treatment (diffusion heat treatment).

The Al vapor deposited layer-equipped stainless steel sheet can be produced, for example, in the following manner:

Molten steel having the foregoing chemical composition (the chemical composition of the base steel sheet of the Al vapor deposited layer-equipped stainless steel sheet) is prepared by steelmaking through a commonly known method such as using a converter, an electric furnace, or a vacuum melting furnace, and is subjected to continuous casting or ingot casting and blooming to obtain a slab.

The slab is then rolled to obtain a ferritic stainless steel sheet as a base steel sheet.

The rolling method is not limited, and a conventional method may be used. Examples include a method of subjecting the slab to hot rolling to obtain a hot-rolled steel sheet and subjecting the hot-rolled steel sheet to cold rolling and cold-rolled sheet annealing, and a method of subjecting the slab to hot rolling to obtain a hot-rolled steel sheet and subjecting the hot-rolled steel sheet to hot-rolled sheet annealing and then to cold rolling. Hot-rolled sheet annealing and cold-rolled sheet annealing are optional processes, and only one or both of the processes may be performed or none of the processes may be performed. The conditions of hot rolling, hot-rolled sheet annealing, cold rolling, and cold-rolled sheet annealing are not limited, and may be in accordance with conventional methods.

For example, the slab is heated at 1100° C. to 1250° C. for 1 hour to 24 hours, and then subjected to hot rolling to obtain a hot-rolled steel sheet with a thickness of approximately 2.0 mm to 6.0 mm. After this, the hot-rolled steel sheet is optionally subjected to descaling by pickling or mechanical polishing, and further subjected to cold rolling and cold-rolled sheet annealing, to obtain a ferritic stainless steel sheet (material ferritic stainless steel sheet) of a predetermined thickness as a base steel sheet.

The ferritic stainless steel sheet as the base steel sheet is then subjected to Al vapor deposition, to yield an Al vapor deposited layer-equipped stainless steel sheet.

As the vapor deposition method, a known PVD method such as a vacuum vapor deposition method or a sputtering method may be used. The vacuum vapor deposition method is preferable. The vapor deposition conditions may be in accordance with conventional methods.

The thickness of the Al vapor deposited layer can be controlled, for example, in the following manner. Masking tape of 10 mm square is attached to part of the region of the base steel sheet subjected to Al vapor deposition. After the Al vapor deposition treatment, the masking tape is peeled off the base steel sheet. The height difference between the vapor deposited part (the region where the masking tape has not been attached) and the non-vapor deposited part (the region where the masking tape has been attached) is then measured using a contact-type surface roughness measurement device. The height difference is taken to be the thickness of the Al vapor deposited layer. The same operation is performed a plurality of times while varying the treatment time in the Al vapor deposition, to determine the relationship between the treatment time and the thickness of the Al vapor deposited layer formed as a result of vapor deposition. From the determined relationship, the treatment time for obtaining the desired Al vapor deposition thickness is calculated. The thickness of the Al vapor deposited layer can thus be controlled.

In the Al vapor deposition, the base steel sheet cut to an appropriate size may be treated in a batch furnace. From the viewpoint of productivity, however, it is preferable to use a continuous vapor deposition device capable of continuously treating a steel strip (foil strip).

The Al vapor deposition may be performed after working the steel sheet into a predetermined part shape. In the case where the shape is complex, however, it may be difficult to form a uniform Al vapor deposited layer on the whole surface. Accordingly, the Al vapor deposition is preferably performed on the base steel sheet or the steel strip (foil strip) before work.

Examples

Slabs having the chemical compositions shown in Table 1 (the balance consisting of Fe and inevitable impurities) were each prepared by steelmaking using a 50 kg small vacuum melting furnace. The slabs were each heated to 1200° C., and then subjected to hot rolling in a temperature range of 900° C. to 1200° C. to obtain a hot-rolled steel sheet with a thickness of 2.0 mm. For steel ID "N" in Table 1, cracking occurred in the hot rolling, and therefore the subsequent evaluation was not performed. The obtained hot-rolled steel sheet was then subjected to hot-rolled sheet annealing at 900° C. for 1 minute in air. After surface scale was removed by pickling, the hot-rolled steel sheet was subjected to cold rolling to obtain a cold-rolled steel sheet with a thickness of 0.3 mm.

The cold-rolled steel sheet was subjected to cold-rolled sheet annealing of holding at 900° C. for 20 seconds in a mixed atmosphere of $H_2$ and $N_2$ ($H_2$:$N_2$=75:25 in volume ratio), and then further subjected to cold rolling to obtain a base steel sheet (material ferritic stainless steel sheet) with the thickness shown in Table 2.

Subsequently, a test piece of 300 mm in length and 100 mm in width was cut from the obtained base steel sheet, and an Al vapor deposited layer with the thickness (thickness per one side) shown in Table 2 was formed on both sides of the test piece by a vacuum vapor deposition method, thus obtaining an Al vapor deposited layer-equipped stainless steel sheet. The thickness of the Al vapor deposited layer was measured using a SEM by the method described above.

After this, each obtained Al vapor deposited layer-equipped stainless steel sheet was subjected to a heat treatment (diffusion heat treatment), thus obtaining a ferritic stainless steel sheet as a finished product (hereafter the term "ferritic stainless steel sheet" denotes a "ferritic stainless steel sheet as a finished product" unless otherwise stated).

The heat treatment was conducted by holding the steel sheet at 1100° C. for 30 minutes in a vacuum of $1\times10^{-1}$ Pa or less and allowing furnace cooling.

The chemical composition of the resultant ferritic stainless steel sheet was measured by collecting chips from part of the ferritic stainless steel sheet and performing wet analysis. The measurement results are shown in Table 3. The balance consists of Fe and inevitable impurities.

Moreover, the obtained ferritic stainless steel sheet and Al vapor deposited layer-equipped stainless steel sheet were used to evaluate (1) deformation caused by heat treatment, (2) workability, (3) electrical resistivity, and (4) oxidation resistance, as described below. The evaluation results are shown in Table 4.

(1) Deformation in Heat Treatment

The deformation (deformation by warpage or distortion) in the heat treatment was evaluated as follows:

Three test pieces with a length of 30 mm and a width of 10 mm were cut from the Al vapor deposited layer-equipped stainless steel sheet before the heat treatment, and these test pieces were subjected to a heat treatment (holding at 1100°

C. for 30 minutes in a vacuum of $1.0\times10^{-1}$ Pa or less and then allowing furnace cooling) simulating the diffusion heat treatment.

The length of each test piece after the heat treatment at the center in the width direction was then measured, and the shape change rate was calculated according to the following formula:

[shape change rate (%)]=([the length of the test piece after the heat treatment (mm)]−[the length of the test piece before the heat treatment (mm)])/[the length of the test piece before the heat treatment (mm)]×100.

The average value of the shape change rates of the three test pieces was then calculated. In the case where the shape change rate was within ±3%, the sample was evaluated as good. In the case where the shape change rate was beyond ±3%, the sample was evaluated as poor.

(2) Workability

The workability was evaluated by subjecting the foregoing ferritic stainless steel sheet to corrugation typically performed on metal heating elements used in exhaust gas purifiers of vehicles.

The ferritic stainless steel sheet (length: 80 mm, width: 50 mm) was corrugated by passing the steel sheet between two gear-type rolls with a maximum bending radius of 0.5 mm, a wave pitch of 2.0 mm, and a wave height of 2.0 mm. In the case where the ferritic stainless steel sheet was able to be worked with no fracture or cracking, the ferritic stainless steel sheet was evaluated as good. In the case where a fracture or cracking occurred, the ferritic stainless steel sheet was evaluated as poor.

(3) Electrical Resistivity

The electrical resistivity was measured by the four-terminal method defined in JIS C 2525.

Five test pieces of 10 mm×80 mm were cut from the foregoing ferritic stainless steel sheet, and the volume resistivity of each test piece was measured. Their average value was taken to be the volume resistivity of the ferritic stainless steel sheet, which was evaluated based on the following criteria:

excellent: volume resistivity of more than 170 μΩ·cm good: volume resistivity of more than 142 μΩ·cm and 170 μΩ·cm or less poor: volume resistivity of 142 μΩ·cm or less.

(4) Oxidation Resistance

The oxidation resistance was evaluated by an oxidation test of holding in high-temperature air.

Two test pieces with a width of 20 mm and a length of 30 mm were collected from the foregoing ferritic stainless steel sheet, and subjected to a treatment of oxidizing in an air atmosphere at 1100° C. for 400 hours. The mass gain by oxidation between before and after the treatment (the value obtained by dividing the amount of mass change of the test piece between before and after the oxidation treatment by the surface area of the test piece before the oxidation treatment) was measured. The average value of the mass gains by oxidation of the test pieces was taken to be the mass gain by oxidation of the ferritic stainless steel sheet, which was evaluated based on the following criteria:

excellent: mass gain by oxidation of 8.0 $g/m^2$ or less good: mass gain by oxidation of more than 8.0 $g/m^2$ and 12.0 $g/m^2$ or less poor: mass gain by oxidation of more than 12.0 $g/m^2$, or occurrence of layer exfoliation.

TABLE 1

| Steel ID | Chemical composition of base steel sheet (mass %) C | Si | Mn | P | S | Cr | A | Ni | Mo | N | Zr | Hf | Others | Remarks |
|---|---|---|---|---|---|---|---|---|---|---|---|---|---|---|
| A | 0.006 | 0.15 | 0.12 | 0.024 | 0.001 | 20.5 | 5.6 | 0.14 | 0.04 | 0.006 | 0.03 | — | La: 0.075 | Conforming steel |
| B | 0.005 | 0.15 | 0.11 | 0.023 | 0.001 | 20.0 | 5.7 | 0.15 | 3.11 | 0.006 | 0.03 | — | La: 0.085 | Conforming steel |
| C | 0.005 | 0.14 | 0.11 | 0.024 | 0.001 | 20.3 | 5.8 | 0.16 | 0.11 | 0.006 | 0.03 | — | — | Conforming steel |
| D | 0.006 | 0.14 | 0.12 | 0.024 | 0.001 | 20.1 | 5.8 | 0.15 | 0.10 | 0.006 | — | 0.07 | — | Conforming steel |
| E | 0.012 | 0.15 | 0.14 | 0.025 | 0.001 | 20.1 | 5.1 | 0.13 | 0.04 | 0.005 | 0.04 | 0.12 | — | Conforming steel |
| F | 0.008 | 0.21 | 0.13 | 0.024 | 0.002 | 11.5 | 5.4 | 0.21 | 0.50 | 0.018 | — | 0.08 | Ti: 0.18, W: 0.6 | Conforming steel |
| G | 0.006 | 0.25 | 0.51 | 0.025 | 0.002 | 15.6 | 4.2 | 0.14 | 1.07 | 0.006 | — | 0.12 | Y:0.13, Cu:0.08 | Conforming steel |
| H | 0.005 | 0.85 | 0.12 | 0.023 | 0.001 | 11.3 | 6.3 | 0.16 | 5.43 | 0.008 | 0.05 | — | La: 0.033, Ce: 0.056, Nb: 0.20 | Conforming steel |
| I | 0.008 | 0.13 | 0.13 | 0.025 | 0.002 | 29.5 | 5.4 | 0.15 | 0.03 | 0.017 | 0.04 | 0.12 | B: 0.0035, Ca: 0.0019, Mg: 0.0015 | Conforming steel |
| J | 0.006 | 0.85 | 0.15 | 0.024 | 0.001 | 20.3 | 4.9 | 0.45 | 0.05 | 0.005 | 0.16 | — | La: 0.086, Cu: 0.08 | Conforming steel |
| K | 0.006 | 0.16 | 0.15 | 0.025 | 0.001 | 20.1 | 5.1 | 0.16 | 0.06 | 0.006 | 0.15 | — | V: 0.11, Ca: 0.0019, Mg: 0.0015 | Conforming steel |
| L | 0.015 | 0.15 | 0.32 | 0.021 | 0.001 | 20.3 | 5.5 | 0.18 | —- | 0.006 | 0.03 | — | — | ***Comparative steel*** |
| M | 0.016 | 0.15 | 0.30 | 0.025 | 0.001 | 20.2 | 5.6 | 0.15 | 0.05 | 0.006 | - | - | — | ***Comparative steel*** |
| N | 0.005 | 0.16 | 0.11 | 0.025 | 0.001 | 20.0 | ***7.5*** | 0.15 | 0.06 | 0.005 | 0.03 | — | — | ***Comparative steel*** |
| O | 0.025 | 0.15 | 0.11 | 0.025 | 0.001 | 20.1 | 5.4 | 0.15 | 0.13 | 0.006 | 0.03 | — | La: 0.071 | Conforming steel |
| P | 0.006 | 0.15 | 0.93 | 0.026 | 0.001 | 20.3 | 5.5 | 0.15 | 1.42 | 0.007 | 0.03 | — | La: 0.082 | Conforming steel |

TABLE 2

| No. | Steel ID | Al vapor deposited layer-equipped stainless steel sheet Thickness of base steel sheet (um) | Thickness of Al vapor deposited layer (μm) | Remarks |
|---|---|---|---|---|
| 1 | A | 50 | ***0.3*** | ***Comparative Example*** |
| 2 | A | 30 | 1.1 | Example |
| 3 | A | 80 | 3.0 | Example |
| 4 | A | 100 | 6.2 | Example |
| 5 | A | 100 | 9.8 | Example |
| 6 | A | 30 | ***12.0*** | ***Comparative Example*** |
| 7 | B | 50 | 3.0 | Example |
| 8 | B | 80 | 3.1 | Example |
| 9 | B | 100 | 5.0 | Example |
| 10 | C | 50 | 5.0 | Example |
| 11 | D | 50 | 4.9 | Example |
| 12 | E | 50 | 5.0 | Example |
| 13 | F | 50 | 5.2 | Example |
| 14 | G | 50 | 5.1 | Example |

TABLE 2-continued

| No. | Steel ID | Al vapor deposited layer-equipped stainless steel sheet: Thickness of base steel sheet (um) | Thickness of Al vapor deposited layer (μm) | Remarks |
|---|---|---|---|---|
| 15 | H | 50 | 5.0 | Example |
| 16 | I | 50 | 5.1 | Example |
| 17 | J | 50 | 5.0 | Example |
| 18 | K | 50 | 5.0 | Example |
| 19 | L | 50 | 5.0 | ***Comparative Example*** |
| 20 | M | 50 | 5.0 | ***Comparative Example*** |
| 21 | N | ***Not evaluated because cracking occurred in hot rolling*** | | ***Comparative Example*** |
| 22 | O | 50 | 5.1 | Example |
| 23 | P | 50 | 5.0 | Example |

TABLE 3

| | Ferritic stainless steel sheet | | | | | | | |
|---|---|---|---|---|---|---|---|---|
| | Steel | Thickness | Chemical composition (mass %) | | | | | |
| No. | ID | (μm) | C | Si | Mn | P | S | Cr |
| 1 | A | 50 | 0.006 | 0.15 | 0.11 | 0.024 | 0.001 | 20.4 |
| 2 | A | 30 | 0.005 | 0.14 | 0.12 | 0.024 | 0.001 | 20.1 |
| 3 | A | 80 | 0.005 | 0.14 | 0.11 | 0.024 | 0.001 | 19.8 |
| 4 | A | 100 | 0.004 | 0.14 | 0.11 | 0.023 | 0.001 | 19.6 |
| 5 | A | 100 | 0.004 | 0.14 | 0.11 | 0.024 | 0.001 | 19.6 |
| 6 | A | 30 | 0.003 | 0.15 | 0.11 | 0.023 | 0.001 | 19.8 |
| 7 | B | 50 | 0.004 | 0.15 | 0.10 | 0.022 | 0.001 | 19.8 |
| 8 | B | 80 | 0.004 | 0.15 | 0.10 | 0.023 | 0.001 | 19.5 |
| 9 | B | 100 | 0.003 | 0.14 | 0.11 | 0.022 | 0.001 | 19.6 |
| 10 | C | 50 | 0.003 | 0.13 | 0.10 | 0.023 | 0.001 | 19.9 |
| 11 | D | 50 | 0.005 | 0.13 | 0.10 | 0.024 | 0.001 | 19.8 |
| 12 | E | 50 | 0.010 | 0.13 | 0.13 | 0.024 | 0.001 | 19.8 |
| 13 | F | 50 | 0.005 | 0.18 | 0.12 | 0.024 | 0.001 | 11.1 |
| 14 | G | 50 | 0.005 | 0.23 | 0.50 | 0.025 | 0.001 | 14.9 |
| 15 | H | 50 | 0.005 | 0.84 | 0.10 | 0.023 | 0.001 | 11.2 |
| 16 | I | 50 | 0.008 | 0.12 | 0.12 | 0.024 | 0.001 | 29.1 |
| 17 | J | 50 | 0.005 | 0.84 | 0.13 | 0.023 | 0.001 | 19.8 |
| 18 | K | 50 | 0.005 | 0.15 | 0.13 | 0.024 | 0.001 | 19.6 |
| 19 | L | 50 | 0.014 | 0.15 | 0.30 | 0.020 | 0.001 | 19.9 |
| 20 | M | 50 | 0.015 | 0.14 | 0.28 | 0.024 | 0.001 | 20.0 |
| 21 | N | | | ***Not evaluated because*** | | ***cracking occurred*** | ***in hot rolling*** | |
| 22 | O | 50 | 0.023 | 0.14 | 0.09 | 0.023 | 0.001 | 19.6 |
| 23 | P | 50 | 0.004 | 0.14 | 0.91 | 0.025 | 0.001 | 19.9 |

| | Ferritic stainless steel sheet Chemical composition (mass %) | | | | | | | |
|---|---|---|---|---|---|---|---|---|
| No. | Al | Ni | Mo | N | Zr | Hf | Others | Remarks |
| 1 | ***6.0*** | 0.13 | 0.04 | 0.006 | 0.03 | — | La: 0.073 | ***Comparative Example*** |
| 2 | 8.1 | 0.13 | 0.03 | 0.006 | 0.03 | — | La: 0.072 | Example |
| 3 | 8.3 | 0.12 | 0.03 | 0.005 | 0.03 | — | La: 0.074 | Example |
| 4 | 9.5 | 0.12 | 0.03 | 0.005 | 0.03 | — | La: 0.072 | Example |
| 5 | 12.3 | 0.12 | 0.02 | 0.005 | 0.03 | — | La: 0.072 | Example |
| 6 | ***25.8*** | 0.12 | 0.02 | 0.005 | 0.02 | — | La: 0.070 | ***Comparative Example*** |
| 7 | 9.1 | 0.13 | 2.94 | 0.006 | 0.03 | — | La: 0.081 | Example |
| 8 | 8.2 | 0.12 | 3.07 | 0.005 | 0.03 | — | La: 0.079 | Example |
| 9 | 8.6 | 0.13 | 2.83 | 0.005 | 0.02 | — | La: 0.080 | Example |
| 10 | 11.5 | 0.15 | 0.09 | 0.005 | 0.03 | — | — | Example |
| 11 | 11.9 | 0.12 | 0.08 | 0.004 | — | 0.06 | — | Example |
| 12 | 12.2 | 0.12 | 0.03 | 0.004 | 0.04 | 0.10 | — | Example |
| 13 | 12.3 | 0.20 | 0.48 | 0.017 | — | 0.06 | Ti: 0.15, W: 0.6 | Example |
| 14 | 11.9 | 0.13 | 0.98 | 0.006 | — | 0.11 | Y: 0.12, Cu: 0.08 | Example |
| 15 | 12.4 | 0.16 | 5.39 | 0.006 | 0.05 | — | La: 0.032, Ce: 0.018, Nb: 0.18 | Example |
| 16 | 10.3 | 0.14 | 0.02 | 0.015 | 0.03 | 0.10 | B: 0.0034, Ca: 0.0017, Mg: 0.0014 | Example |
| 17 | 10.9 | 0.43 | 0.03 | 0.004 | 0.13 | — | La: 0.085, Cu: 0.06 | Example |
| 18 | 12.3 | 0.15 | 0.05 | 0.004 | 0.12 | — | V: 0.09, Ca: 0.0018, Mg: 0.0013 | Example |
| 19 | 12.1 | 0.16 | **-** | 0.005 | 0.03 | — | — | ***Comparative Example*** |
| 20 | 10.8 | 0.14 | 0.04 | 0.006 | **-** | **-** | — | ***Comparative Example*** |

TABLE 3-continued

| | | | | | | | | |
|---|---|---|---|---|---|---|---|---|
| 21 | ***Not evaluated because cracking occurred in hot rolling*** | | | | | | | ***Comparative Example*** |
| 22 | 9.3 | 0.14 | 0.12 | 0.005 | 0.03 | — | La: 0.068 | Example |
| 23 | 9.6 | 0.13 | 1.39 | 0.006 | 0.02 | — | La: 0.076 | Example |

TABLE 4

| | Evaluation results | | | | | | |
|---|---|---|---|---|---|---|---|
| | (1) | | (3) Electrical resistivity | | (4) Oxidation resistance | | |
| No. | Deformation in heat treatment | (2) Workability | Volume resistivity (μΩ · cm) | Evaluation | Mass gain by oxidation (g/m$^2$) | Evaluation | Remarks |
| 1 | Good | Good | 131 | Poor | 6.8 | Excellent | ***Comparative Example*** |
| 2 | Good | Good | 152 | Good | 6.1 | Excellent | Example |
| 3 | Good | Good | 155 | Good | 5.9 | Excellent | Example |
| 4 | Good | Good | 171 | Excellent | 5.8 | Excellent | Example |
| 5 | Good | Good | 185 | Excellent | 5.9 | Excellent | Example |
| 6 | Good | Poor | Evaluation omitted | | Evaluation omitted | | ***Comparative Example*** |
| 7 | Good | Good | 181 | Excellent | 6.1 | Excellent | Example |
| 8 | Good | Good | 165 | Good | 7.2 | Excellent | Example |
| 9 | Good | Good | 172 | Excellent | 6.9 | Excellent | Example |
| 10 | Good | Good | 186 | Excellent | 8.9 | Good | Example |
| 11 | Good | Good | 191 | Excellent | 6.2 | Excellent | Example |
| 12 | Good | Good | 195 | Excellent | 7.5 | Excellent | Example |
| 13 | Good | Good | 158 | Good | 10.5 | Good | Example |
| 14 | Good | Good | 159 | Good | 6.1 | Excellent | Example |
| 15 | Good | Good | 181 | Excellent | 10.8 | Good | Example |
| 16 | Good | Good | 231 | Excellent | 5.8 | Excellent | Example |
| 17 | Good | Good | 195 | Excellent | 9.1 | Good | Example |
| 18 | Good | Good | 192 | Excellent | 8.9 | Good | Example |
| 19 | Poor | Good | 181 | Excellent | 6.3 | Excellent | ***Comparative Example*** |
| 20 | Good | Good | 179 | Excellent | 18 | Poor | ***Comparative Example*** |
| 21 | ***Not evaluated because cracking occurred in hot rolling*** | | | | | | ***Comparative Example*** |
| 22 | Good | Good | 173 | Excellent | 6.1 | Excellent | Example |
| 23 | Good | Good | 176 | Excellent | 5.9 | Excellent | Example |

As can be understood from Table 4, all Examples had little deformation due to heat treatment, and had superior workability, electrical resistivity, and oxidation resistance.

In all Comparative Examples, on the other hand, cracking occurred in hot rolling and test pieces could not be produced, or at least one of deformation in heat treatment, workability, electrical resistivity, and oxidation resistance was not satisfactory.

In No. 6, after the diffusion heat treatment, the steel sheet became significantly brittle and the predetermined test pieces could not be collected. Accordingly, the evaluation of (3) electrical resistivity and (4) oxidation resistance was omitted.

REFERENCE SIGNS LIST

1 ferritic stainless steel sheet
2 Al vapor deposited layer-equipped stainless steel sheet
3 base steel sheet
4 Al vapor deposited layer

The invention claimed is:

1. A method of producing a ferritic stainless steel sheet having a thickness of 100 μm or less and a chemical composition consisting of, in mass %, C: 0.030% or less,
Si: 1.0% or less,
Mn: 1.0% or less,
P: 0.040% or less,
S: 0.010% or less,
Cr: 11.0% to 30.0%,
Al: 10.9% to 20.0%,
Ni: 0.05% to 0.50%,
Mo: 0.01% to 6.0%,
N: 0.020% or less, and
at least one selected from the group consisting of Zr: 0.01% to 0.20% and Hf: 0.01% to 0.20%,
with a balance consisting of Fe and inevitable impurities, the method comprising
subjecting an Al vapor deposited layer-equipped stainless steel sheet to a heat treatment of holding in a temperature range of 600° C. to 1300° C. for 1 minute or more,
wherein the Al vapor deposited layer-equipped stainless steel sheet comprising:
a base steel sheet; and
an Al vapor deposited layer on a surface of the base steel sheet,
wherein the base steel sheet is a ferritic stainless steel sheet having a thickness of 100 μm or less and a chemical composition consisting of, in mass %,
C: 0.030% or less,
Si: 1.0% or less,
Mn: 1.0% or less,
P: 0.040% or less,
S: 0.010% or less,
Cr: 11.0% to 30.0%,
Al: 4.0% to 6.5%,
Ni: 0.05% to 0.50%,
Mo: 0.01% to 6.0%,
N: 0.020% or less, and at least one selected from the group consisting of Zr: 0.01% to 0.20% and Hf: 0.01% to 0.20%, with a balance consisting of Fe and inevitable impurities, and a thickness of the Al vapor deposited layer per one side is 0.5 μm to 10.0 μm.

2. The method according to claim 1, wherein Al content of the chemical composition of the base steel sheet is 5.5 mass % to 6.5 mass %.

3. A method of producing a ferritic stainless steel sheet having a thickness of 100 μm or less and a chemical composition consisting of, in mass %, C: 0.030% or less,
Si: 1.0% or less,
Mn: 1.0% or less,
P: 0.040% or less,
S: 0.010% or less,
Cr: 11.0% to 30.0%,
Al: 10.9% to 20.0%,
Ni: 0.05% to 0.50%,
Mo: 0.01% to 6.0%,
N: 0.020% or less, and at least one selected from the group consisting of Zr: 0.01% to 0.20% and Hf: 0.01% to 0.20%, and one or more selected from the group consisting of
REM: 0.01% to 0.20%,
Cu: 0.01% to 0.10%,
Ti: 0.01% to 0.50%,
V: 0.01% to 0.50%,
W: 0.01% to 6.0%,
B: 0.0001% to 0.0050%,
Ca: 0.0002% to 0.0100%, and
Mg: 0.0002% to 0.0100%, with a balance consisting of Fe and inevitable impurities, the method comprising subjecting an Al vapor deposited layer-equipped stainless steel sheet to a heat treatment of holding in a temperature range of 600° C. to 1300° C. for 1 minute or more, wherein the Al vapor deposited layer-equipped stainless steel sheet comprising:

a base steel sheet; and an Al vapor deposited layer on a surface of the base steel sheet, wherein the base steel sheet is a ferritic stainless steel sheet having a thickness of 100 μm or less and a chemical composition consisting of, in mass %, C: 0.030% or less,
Si: 1.0% or less,
Mn: 1.0% or less,
P: 0.040% or less,
S: 0.010% or less,
Cr: 11.0% to 30.0%,
Al: 4.0% to 6.5%,
Ni: 0.05% to 0.50%,
Mo: 0.01% to 6.0%,
N: 0.020% or less, and at least one selected from the group consisting of Zr: 0.01% to 0.20% and Hf: 0.01% to 0.20%, and one or more selected from the group consisting of
REM: 0.01% to 0.20%,
Cu: 0.01% to 0.10%,
Ti: 0.01% to 0.50%,
V: 0.01% to 0.50%,
W: 0.01% to 6.0%,
B: 0.0001% to 0.0050%,
Ca: 0.0002% to 0.0100%, and
Mg: 0.0002% to 0.0100%, with a balance consisting of Fe and inevitable impurities, and a thickness of the Al vapor deposited layer per one side is 0.5 μm to 10.0 μm.

4. The method according to claim 3, wherein Al content of the chemical composition of the base steel sheet is 5.5 mass % to 6.5 mass %.

* * * * *